(12) United States Patent
Wong et al.

(10) Patent No.: US 9,824,170 B1
(45) Date of Patent: Nov. 21, 2017

(54) MESSAGE FILTERING FOR ELECTRONIC DESIGN AUTOMATION SYSTEMS

(71) Applicant: Xilinx, Inc., San Jose, CA (US)

(72) Inventors: Alec J. Wong, San Jose, CA (US); Pradip K. Jha, Cupertino, CA (US); Steven Banks, Sunnyvale, CA (US); Sudipto Chakraborty, Longmont, CO (US); Dennis McCrohan, Brier, WA (US)

(73) Assignee: XILINX, INC., San Jose, CA (US)

( * ) Notice: Subject to any disclaimer, the term of this patent is extended or adjusted under 35 U.S.C. 154(b) by 52 days.

(21) Appl. No.: 14/989,676

(22) Filed: Jan. 6, 2016

(51) Int. Cl.
*G06F 17/00* (2006.01)
*G06F 17/50* (2006.01)

(52) U.S. Cl.
CPC ...... *G06F 17/5045* (2013.01); *G06F 17/5068* (2013.01)

(58) Field of Classification Search
USPC .......................................... 716/122; 707/102
See application file for complete search history.

(56) References Cited

U.S. PATENT DOCUMENTS

| | | | | |
|---|---|---|---|---|
| 2003/0078985 A1* | 4/2003 | Holbrook | ................ | H04L 29/06 709/213 |
| 2004/0236780 A1* | 11/2004 | Blevins | ................... | G06F 9/542 |
| 2005/0141501 A1* | 6/2005 | Kadambi | ............... | H04L 69/161 370/389 |
| 2006/0209807 A1* | 9/2006 | Lor | ..................... | H04L 12/5601 370/352 |
| 2013/0152187 A1* | 6/2013 | Strebe | ................... | H04L 63/101 726/11 |

OTHER PUBLICATIONS

Mentor Graphics, "Calibre Pattern Matching," copyright 2010, pp. 1-2, Mentor Graphics, Wilsonville, Oregon, USA.
Synopsys, "Synthesis Quick Reference," Version May 2000, May 2000, pp. 1-275, Synopsys, Inc., Mountain View, California.
"How to suppress error message in synopsys DC," [Online] EDABoard.com, a Design World Resource, vBulletin Solutions, Inc., Copyright 2010 [retrieved Nov. 1, 2015] retrieved from the Internet: <http://www.edaboard.com/thread32443.html>, 3 pg.

* cited by examiner

*Primary Examiner* — Mohammed Alam
(74) *Attorney, Agent, or Firm* — Kevin T. Cuenot

(57) ABSTRACT

Message filtering may include, during a first processing phase of a design specified in source code, creating a filter table including message filters and storing the filter table in a memory using a processor. Each message filter may specify a message criterion and an object identifier of the design. During a subsequent processing phase of the design, received messages may be compared with the message filters of the filter table using the processor. Responsive to determining that a selected message matches a message criterion and an object identifier of a selected message filter, the message may be suppressed using the processor.

20 Claims, 4 Drawing Sheets

MESSAGE FILTERING FOR ELECTRONIC DESIGN AUTOMATION SYSTEMS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to circuit design and, more particularly, to message filtering for an electronic design automation system.

BACKGROUND

An electronic design automation (EDA) system is a computer-based tool for designing electronic systems such as printed circuit boards and integrated circuits. When processing a design, an EDA system generates a large number of messages. Upon generation, these messages may be provided to a user through a message file or surfaced to the user through a user interface. As an illustrative example, when processing a design, an EDA system may generate hundreds or thousands of messages.

Not all of the messages generated by the EDA system, however, may be useful to the user. Some messages, e.g., warning messages, may be expected and therefore of little use to the user. For example, a user may use a third party core within a circuit design. As the core is processed, the EDA system may generate one or more warning messages relating to the core. Since the user is unable to change or modify the core, the messages are of little use. Moreover, the product literature for the core may indicate that the messages are expected from particular EDA systems, but are not of concern. In such cases, users may view these messages as somewhat of a nuisance.

Accordingly, in some cases, preventing messages from reaching the user may be beneficial. Some EDA systems provide users with the ability to prevent messages generated during operation from being provided to the user. Often, available message suppression techniques are runtime inefficient. Further, available message suppression techniques do not provide users with the implementation options necessary to prevent an overly broad application of message suppression that suppresses messages beyond those intended to be suppressed. This may result in suppression of important messages that would be of significant value to the user.

SUMMARY

A method of message filtering may include, during a first processing phase of a design specified in source code, creating a filter table including message filters and storing the filter table in a memory using a processor. Each message filter may specify a message criterion and an object identifier of the design. The method may include, during a subsequent processing phase of the design, comparing received messages with the message filters of the filter table using the processor. The method may also include, responsive to determining that a selected message matches a message criterion and an object identifier of a selected message filter, suppressing the message using the processor.

A system for message filtering may include a processor programmed to initiate executable operations. The executable operations may include, during a first processing phase of a design specified in source code, creating a filter table including message filters and storing the filter table in a memory. Each message filter may specify a message criterion and an object identifier of the design. The executable operations also may include, during a subsequent processing phase of the design, comparing received messages with the message filters of the filter table and, responsive to determining that a selected message matches a message criterion and an object identifier of a selected message filter, suppressing the message.

A non-transitory computer-readable medium has instructions stored thereon which, when executed by a processor, perform a method of message filtering. The method may include, during a first processing phase of a design specified in source code, creating a filter table including message filters and storing the filter table in a memory using the processor. Each message filter may specify a message criterion and an object identifier of the design. The method also may include, during a subsequent processing phase of the design, comparing received messages with the message filters of the filter table using the processor. The method further may include, responsive to determining that a selected message matches a message criterion and an object identifier of a selected message filter, suppressing the message using the processor.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
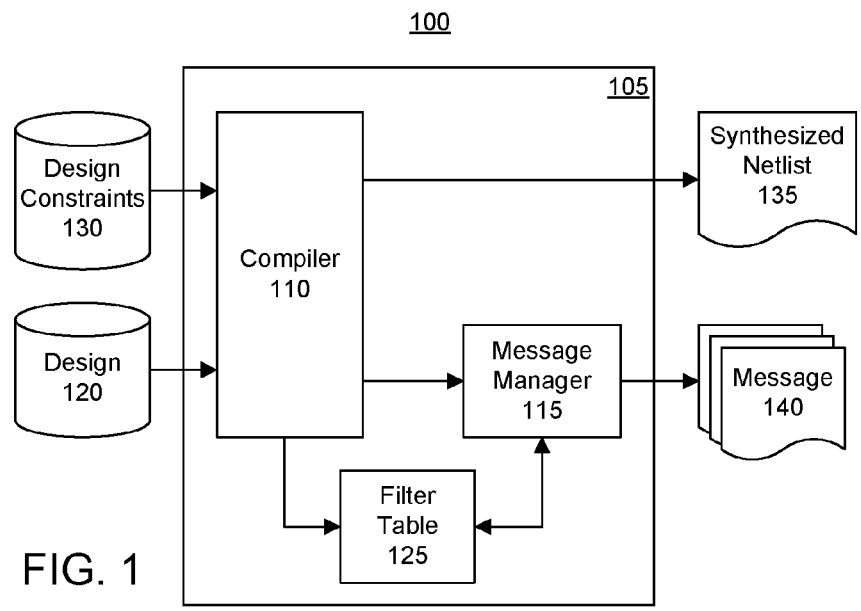
FIG. 1 is a block diagram showing a high level example of message filtering within an electronic design automation (EDA) system.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to circuit design and, more particularly, to message filtering for an electronic design automation (EDA) system. In accordance with the inventive arrangements described within this disclosure, messages may be filtered and suppressed according to the particular object being processed by the EDA system at or about the time the messages are generated. Further, particular types of messages may be selected for suppression. By utilizing both the message type and the object of the design to which the message pertains, targeted message suppression may be performed.

In one arrangement, a filter table may be generated dynamically while the design is being processed. For example, the design may be traversed during a first processing stage. While traversing the design, the filter table may be generated. The filter table may specify one or more message filters that may be applied by the EDA system during a subsequent processing stage.

As an illustrative example, a design may be elaborated. While the design is elaborated, the EDA system may generate message filters as the design is traversed. The message filters may be persisted to the filter table in memory. During a subsequent processing stage such as synthesis, simulation, or the like, the EDA system may evaluate messages that are generated against the filter table. Those messages determined to match a message filter in the filter table may be suppressed. Messages that do not match a filter in the filter table may be allowed to pass to the user.

In another arrangement, each message filter persisted to the filter table may specify a message criterion. Each message filter may also specify an object identifier of the design. As defined within this specification, the term "object identifier" means a reference to a particular object type or a reference to a particular object instance of a design. The EDA system may determine whether a message matches a message filter in the filter table using the message criterion and/or the object identifier. In cases where the design is hierarchical, the message filters may be applied using inheritance. For example, any message filter that is found to match a message of a particular object instance may also be applied to any message generated for child object instances of the object instance.

In one aspect, the inventive arrangements described herein may be implemented as a method or process for message filtering performed by a data processing system. In another aspect, the inventive arrangements may be implemented as a data processing system having a processor. The processor, upon executing program code, performs operations described herein relating to message filtering. In still another aspect, the inventive arrangements may be implemented as a non-transitory computer-readable storage medium storing program code that, when executed, causes a processor and/or a system to perform and/or initiate a method or process for message filtering. Further details relating to the inventive arrangements are described below with reference to the drawings.

FIG. 1 is a block diagram showing a high level example of message filtering within an EDA system 100. EDA system 100 may be implemented as a data processing system executing an EDA application 105. EDA application 105 may include one or more different computer programs. For purposes of illustration, EDA application 105 is shown to include a compiler 110 and a message manager 115. Compiler 110 may be configured to perform one or more different processes or processing stages upon a design 120.

Design 120 may be specified using source code. As defined within this disclosure, the term "source code" means a collection of computer instructions written using a human-readable computer language such as text. Source code may be specified as a hardware description language (HDL) such as VHDL and/or Verilog. Source code may also be specified as a high level programming language (HLL) such as C, C++, or the like. Accordingly, design 120 may include one or more, e.g., a plurality of, source code files. The files may have a hierarchical data structure. In one example, design 120 may be an HDL design specifying an electronic circuit. In another example, design 120 may be a netlist for an electronic circuit. In still another example, design 120 may be an HLL design to be transformed into an electronic circuit.

In one arrangement, design 120 may be organized as a hierarchical object model. For example, design 120 may have a tree data structure. An example of a tree structure is a file system such as the UNIX® file system. For example, the object model of a file system may have individual nodes in the tree representing files or directories. With the exception of the top level node, e.g., the root directory, all nodes have a single parent node. For each parent node, all direct children of that parent node must have a unique name. A fully-qualified (i.e., canonical) name of an object such as a file is created by stringing together these unique names using a standard delimiter such as "/".

In the case where design 120 is described in HDL, a tree-based object hierarchy may be created during elaboration of design 120. After elaboration, any particular object instance in the hierarchy can be referred to by a fully-qualified object instance name created by stringing together the object instance names of its ancestors with a delimiter, e.g., a delimiter such as "/".

Compiler 110 may implement a first processing stage upon design 120. During, or while performing, the first processing stage, compiler 110 may generate filter table 125. As an illustrative example, compiler 110 may perform netlist generation from design 120 and, in doing so, generate filter table 125 during elaboration of design 120. Compiler 110 may create one or more message filters that are persisted to filter table 125 in memory, whether in persistent memory or non-persistent memory. In one aspect, message filters within filter table 125 may be determined according to design 120 and interpretation of design constraints 130.

As defined herein, the term "design constraint" means a requirement for a portion of a design that is observed or enforced by a computer-based system such as an EDA system. Design constraints 130 may specify one or more message suppression rules for various objects of design 120. A design constraint, for example, may specify a message criterion and a particular object and/or a particular object instance of design 120. The object or object instance is the particular object or object instance, respectively, for which messages generated having the specified message criterion are to be suppressed.

In one aspect, one or more design constraints of design constraints 130 may be static. A static design constraint may be read and applied. In another aspect, one or more design constraints of design constraints 130 may be parameterizable. A parameterizable constraint is a constraint that is dependent upon one or more values of parameters of a module (e.g., an object) to which the parameterizable constraint is to be applied. A parameterizable constraint, for example, is executed or otherwise evaluated by the EDA system and may or may not apply to a particular instance of an object depending upon the parameterization of the instance of the object that is generated.

During a subsequent, or second, processing stage, compiler 110 may perform further processing on design 120. For example, during the subsequent processing stage, compiler 110 may perform further processing on a result obtained from the first processing stage. In one example, compiler 110 may synthesize the generated netlist, perform simulation, or the like. For purposes of illustration, FIG. 1 shows compiler 110 generating a synthesized netlist 135. While performing the subsequent processing stage, message manager 115 may selectively suppress messages according to the message filters stored in filter table 125. Message manager 115 may compare messages generated by compiler 110, another function, and/or process operating on design 120 (or a result of the first processing stage) with message filters persisted in filter table 125.

Responsive to determining that any of the messages match a message filter in filter table 125, message manager 115 may suppress the message. As defined within this disclosure, the term "suppress," as applied to a message, means that the message is not stored in a message log and/or is not provided to a user through an interface. In one aspect, a suppressed message may be deleted or otherwise discarded. In another aspect, a suppressed message may be stored in a message log reserved only for suppressed messages. For example, suppressed messages stored in a message log for suppressed messages may be hidden from user view. Further, in another aspect, the message log for suppressed messages may be displayed only responsive to an explicit user request to do so, thereby preventing suppressed messages from being interspersed or commingled with unsuppressed messages. As such, messages 140 of FIG. 1 represent messages that are not suppressed. Messages 140 may be provided to a user by displaying messages 140 through a user interface, storing messages 140 in a log or other file accessible to the user, or the like for subsequent user review.

The example illustrated in FIG. 1 is provided for purposes of illustration and not limitation. The inventive arrangements described within this disclosure may be applied to other computer-based systems that generate messages directed to the user while operating on an input having a data model, e.g., a data structure, which is hierarchical and/or tree-based as used and/or processed by the computer-based system.

Figure 2:
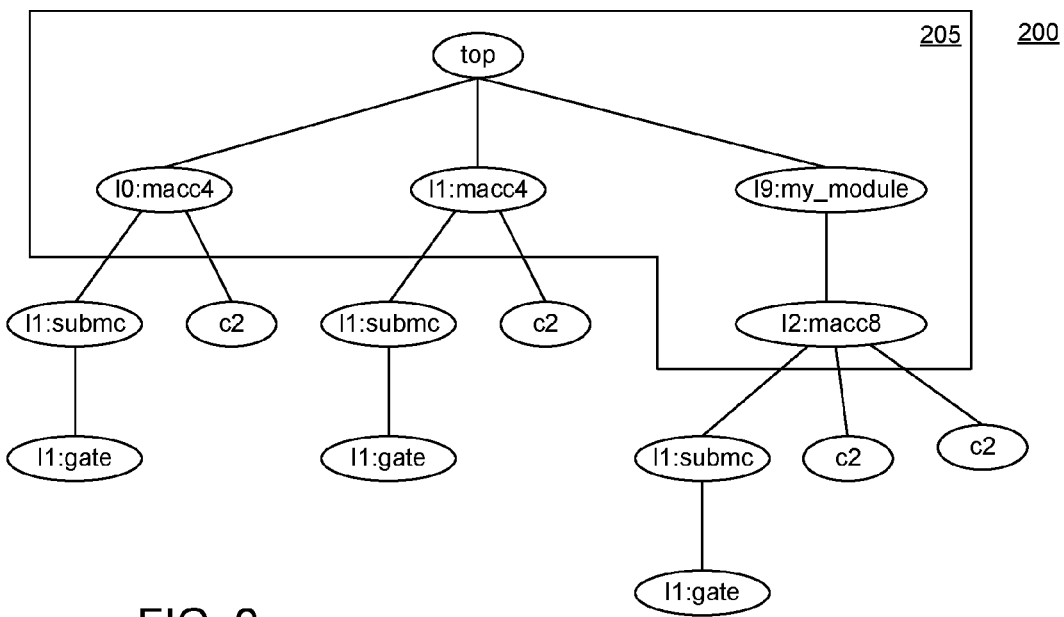
FIG. 2 is an example of an elaborated hardware description language design.

FIG. 2 is an example of an elaborated HDL design 200. In one aspect, HDL design 200, as pictured in FIG. 2, is an example of design 120 after elaboration as processed by EDA system 100 of FIG. 1. HDL design 200 has a tree type data model. Instance names, as shown on nodes of the tree, are labelled with an upper-case "I" followed by a digit. Each instance name is a unique identifier for an object amongst all objects with the same parent. The name, or type, of the object is given in lower-case text. For example, the fully-qualified instance name of "top/I0/I1/I1" refers to the unique object instance of type "gate" in the lower-left region of the tree structure.

The top level node of the tree structure is labelled "top". The top level node has three child nodes referred to as "I0:macc4", "I1:macc4", and "I9:my_module". Each of the child nodes "I0:macc4", "I1:macc4", and "I9:my_module" may represent different modules of HDL design 200. "I0: macc4" and "I1:macc4" represent two different instances of a same object. In this example, "I0:macc4" and "I1:macc4" represent two different instances of a same HDL module "macc4". The module "I9:my_module" represents a user defined module. Instance "I2:macc8" may be a custom core utilized by the designer.

The nodes "top", "I0:macc4", "I1:macc4", "I9:my_module", and "I2:macc8" are shown within a bounding box and may be referred to within this disclosure as a portion of a design to be described in further detail herein.

As noted, FIG. 2 is an example where design 120 may be specified as HDL and elaborated. In another example, design 120 may be expressed as HLL source code. In that case, the object hierarchy may be specified as a call graph. Example 1 illustrates an exemplary portion of C code.

EXAMPLE 1

```
Main( )
{
int a=inc2(1);
}
int inc2(int i)
{
return i+inc( )+inc( );
}
int inc(int i)
{
return i+1;
}
```

Referring to Example 1, a hierarchical name of "main/inc2/inc" may be used to refer to an invocation of function "inc" but only when invoked by "inc2", which must be invoked by "main".

Figure 3:
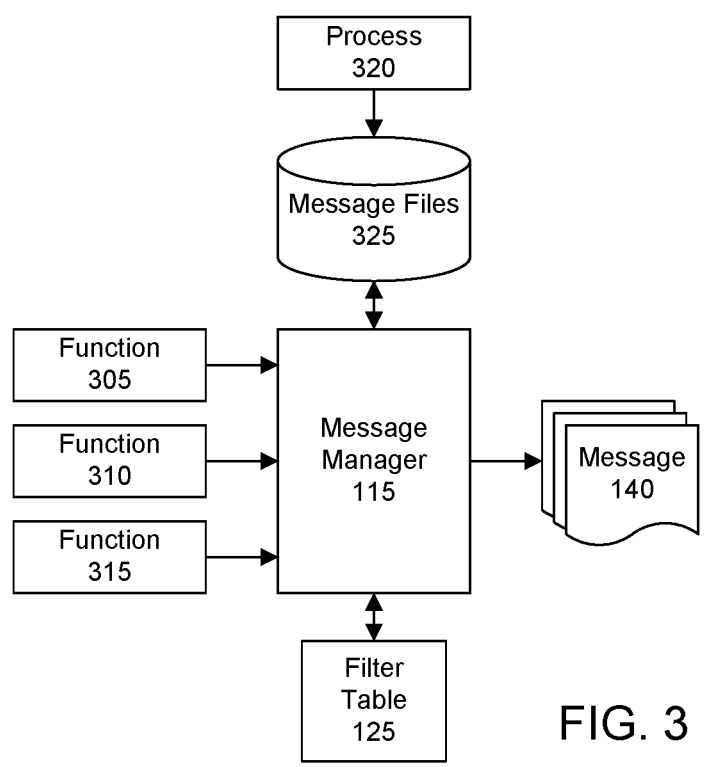
FIG. 3 is a block diagram illustrating exemplary operation of a message manager of an EDA system.

FIG. 3 is a block diagram illustrating exemplary operation of message manager 115 of FIG. 1. FIG. 3 illustrates operation of message manager 115 once filter table 125 is generated. For purposes of illustration, functions 305, 310, and 315 of EDA application 105 are shown and programmed to route messages that are generated during operation through message manager 115. Further, process 320 may generate messages as message files 325.

Message manager 115 may compare messages received from each of functions 305, 310, and 315 to message filters in filter table 125. Message manager 115 may also compare message files 325 to message filters in filter table 125. Message manager 115 may pass only those messages that do not match a message filter from filter table 125 on to the user. As noted, messages 140 represent messages that message manager 115 is not suppressing.

Figure 4:
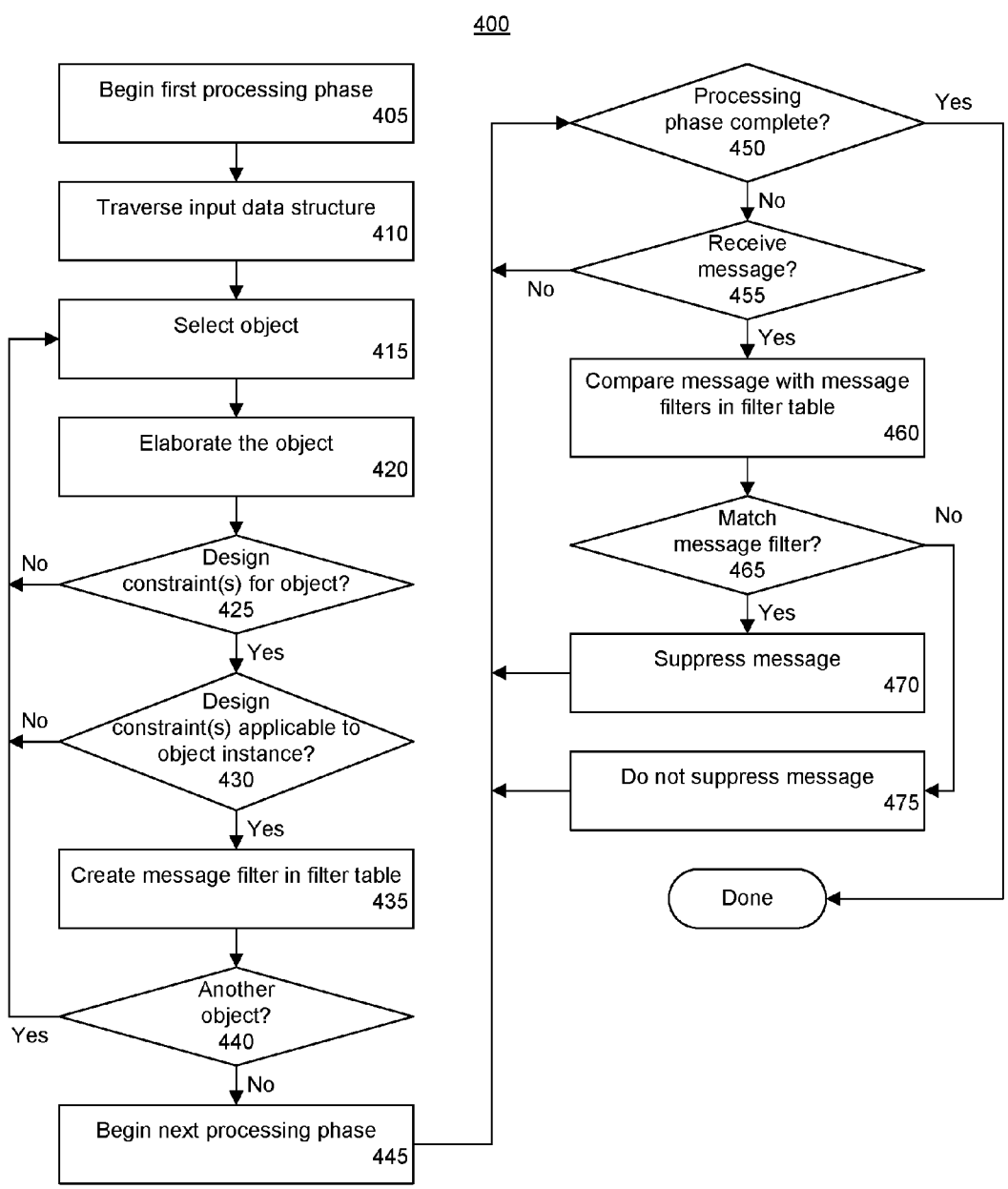
FIG. 4 is a flow chart illustrating an exemplary method of message filtering.

FIG. 4 is a flow chart illustrating an exemplary method 400 of message filtering. Method 400 may be performed by an EDA system (hereafter "system") as described with reference to FIGS. 1 and/or 3.

In block 405, the system may begin a first processing phase. For example, the system may receive a design and begin performing elaboration of the design. The design may be specified in HDL or in a HLL. In general, in the case of an HDL design, the elaboration process constructs a design hierarchy based on the instantiation and configuration information in the design. Elaboration further may establish signal connectivity. During elaboration, memory storage may be allocated for the required signals. The elaboration process may create a hierarchy of object (e.g., HDL module) instances that ends with primitive gates and statements. An "HDL module" is a unit of HDL that is a defined construct within the syntax of the particular HDL that is being used.

An object such as a module is instantiated when the object is actually used and/or inserted into the architecture body. For example, in a complex design, the top level may include subsystems as instantiated components. During elaboration, the system may begin with the top level entity declaration and bind its architecture body according to the configuration specification. If there are instantiated components, the system replaces each instantiated component with the corresponding architecture body description. The process may repeat recursively until all instantiated components are replaced. The elaboration process essentially selects and combines the needed architectural descriptions, and creates a single "flattened" description.

In another aspect, the first processing phase may include generating an intermediate format of the design. For example, the system may generate an intermediate format such as Low Level Virtual Machine (LLVM) or the like. The system may generate an LLVM formatted representation of the design whether the design is specified in HDL or an HLL.

In block 410, the system may begin traversing the data structure of the design. In block 415, the system may select an object of the design. In block 420, the system may elaborate the selected object of the design. In block 420, for example, the system may create one or more object instances. In one example, the selected object may be a parameterizable module. As defined within this disclosure, a "parameterizable module" means a module specified in source code that includes at least one parameter to which one of a plurality of different possible values may be assigned.

In block 425, the system may determine whether any design constraints specifying a filter definition are specified for the selected object. If not, method 400 may loop back to block 415 to select a next object. If so, method 400 may continue to block 430. In block 430, the system may determine whether the design constraint and, more particularly, the filter definition of the design constraint, applies to the object instance created for the selected object.

For example, as the selected object is elaborated, the system may determine whether any design constraints are specified for the selected object as noted in block 425. If so, the system may determine whether the design constraint is applicable to the particular object instance that is created in accordance with the design constraint in block 430.

In one aspect, a design constraint for message suppression for the selected object may be static. A static design constraint may specify a message criterion and a particular object. In that case, the system may generate a message filter for the object instance created for the selected object. The message filter may specify the object instance and the message criterion.

As an illustrative example, the object being elaborated may be an adder object which triggers many messages of "WARNING: [5-9] This function is invalid for given inputs" to be issued with message IDs with subsystem number "5" and message number "9". One example of a design constraint may be static and specify a message criterion such as "5-9", corresponding to the subsystem number and message number in this example that is to be suppressed. Responsive to elaborating the object, the system may generate a message filter specifying an object identifier indicating the object instance and a message criterion of "5-9" in accordance with the static design constraint.

In another aspect, the design constraint for the selected object may be parameterizable. In that case, the design constraint may specify a message criterion and one or more rules or conditions that must be met in order for the design constraint to be applicable to the object instance created. As such, the design constraint may be applicable to some object instances and not others depending upon the parameterization of the object instance.

As an illustrative example, a parameterizable design constraint may indicate that any message generated from an object instance with only particular parameters and that meets the message criterion is to be suppressed. For example, the parameterizable design constraint may indicate that messages having a message identifier such as "5-9" for object instances that are 4-bit adders are to be suppressed, while messages having a message identifier of "5-9" for object instances that are 16 bit adders are not to be suppressed.

The design constraints may specify the conditions, referred to as the filter definition, for message suppression for a particular object type and/or object instance. The message filters applied at runtime from the filter table are applied according to elaboration of the filter definitions against the object hierarchy of the design. The elaboration of filter definitions, e.g., the creation of message filters from the design constraints, may be based upon elaboration-dependent parameters including, but not limited to, VHDL generic values, Verilog defparam values, C macros, e.g., "#define", or the like.

If the design constraint is applicable to the object instance being created, method 400 may continue to block 435. In block 435, the system may create a message filter in the filter table. If the message filter being created in the first message filter, the system first creates the message filter table in memory and adds the message filter to the filter table. The message filter may specify the message criterion of the design constraint and an object identifier of the selected object being elaborated. Table 1 illustrates an example of a filter table.

TABLE 1

| Message Criterion | Object Identifier 1 | Object Identifier 2 | Object Identifier N |
|---|---|---|---|
| 5-9 | a/b/c/d | a/b/x/y | |

Table 1 illustrates an example where the filter table includes one message filter. The message filter has a message criterion. The message criterion may be a message identifier or the like. In this example, the message identifier is "5-9". Further, the message filter may include one or more object identifiers specifying particular objects and/or object instances to which the message filter is applicable. In the example above, the object identifier(s) as specified as paths as illustrated with respect to FIG. 2. The message filter of Table 1 is applicable to object instances having a path of "a/b/c/d" or a path of "a/b/x/y" within the hierarchy or tree structure.

Consider the prior adder object example. The message filter of Table 1 may be for adder object instance and, in particular, an adder object instance that, when elaborated, is identified by the hierarchical path "a/b/c/d" or an adder object instance identified by the hierarchical path "a/b/x/y". The adder object instances specified by hierarchical paths in the message filter may be those instances, e.g., of 4 bit adders, for which messages are to be suppressed. Subsequently, as a message is received, the message filter of Table 1 only suppresses a message having a message identifier of "5-9" and that originates while operating on the object instance (e.g., the 4 bit adder object instance) of the elaborated design located at "a/b/c/d" or "a/b/x/y". Table 1 illustrates that while design constraints may be specified on a per object basis, the message filters, once elaborated, may be specified on an object instance basis.

In block 440, the system may determine whether another object of the design remains to be processed. If so, method 400 may loop back to block 415 to continue processing. If not, method 400 may continue to block 445.

In block 445, the system may begin a next processing phase. In one example, the next processing phase may be synthesis. In another example, the next processing phase may be simulation of the elaborated design. In another example, the next processing phase may be object code generation. It should be appreciated that the next processing phase may be any of a variety of different processes involving the elaborated design where messages are generated while accessing, using, or operating on object instances of the elaborated design.

In block 450, the system may determine whether the current processing phase is complete. If so, method 400 may end. If not, method 400 may continue to block 455. In block 455, the system may determine whether a message has been received. The message manager, for example, may determine whether a message has been received from another function, process, or the like. If so, method 400 may continue to block 460. If not, method 400 may loop back to block 450 to await a message.

In block 460, the system may compare the received message with the message filters in the filter table. Each message, for example, may have two attributes that may be compared with the message filters of the filter table. The two attributes may include a message criterion and an object identifier. The message criterion may be a message identifier as noted. In one aspect, the message criterion is not a unique message instance identifier. The message criterion may indicate a particular type or class of message. For example, the message identifier of a message such as "[1-23] Unable to open your file" may be "1-23" or another string. The message identifier "[1-23] Unable to open your file" may only identify the type of message but not the particular instance of the message.

The object identifier, as noted, may specify a particular instance of a particular type of object in the hierarchy. In one example, the object identifier may specify an object type such as "cell instance" and a path such as "top/I0/I1/I1" as illustrated in FIG. 2. In another example, the object identifier may specify an object type such as "function call" and a path as a call graph of "main/inc2/inc" in reference to Example 1.

In block 465, the system determines whether the message matches a message filter. If the message matches a message filter, method 400 may proceed to block 470 where the message is suppressed. The message manager suppresses the message as described herein. Accordingly, the message is not provided, or otherwise made available, to the user. If the message does not match a message filter, method 400 may proceed to block 475 where the message is not suppressed. In one aspect, the system may utilize caching to hits, e.g., a match of a message with a message filter, to improve runtime operation.

Referring to the example illustrated in Table 1, the system may compare message criterion of the message against the message filters. In one aspect, the system may use the message criterion as an initial matching operation. Responsive to determining that the message has a message criterion of "5-9" matching a message filter, the system may then compare the object identifier of the message with the object identifier of the partially matched message filter. The message, for example, may indicate the particular object instance being processed to which the generated message relates. In one example, the message may specify the object instance "a/b/c/d/e/f". The system may iteratively drop each child name of each leaf node from the path to determine whether a matching message filter exists. For example, the system may compare the entire path "a/b/c/d/e/f" with the object identifiers of the partially matching message filters, drop the "f" and the comparison, then drop the "e" and perform a comparison to determine that "a/b/c/d" does match the message filter in Table 1. Responsive to determining a match, which includes matching both the message criterion and object identifier of the message with the message filter, the system may suppress the message.

For purposes of illustration, consider another example where a received message has a message criterion of "5-9" and an object identifier of "a/b/c/da". In that case, the system may determine that the message partially matches the message filter of Table 1. The system further determines that the object identifier does not match the object identifier of the message filter. Accordingly, the system does not suppress the message since the object identifier "a/b/c/da" of the message does not match the object identifier of the message filter of Table 1.

In another arrangement, message filters may be applied using object inheritance. The system may suppress a message that matches the message criterion of the selected message filter and that is from an object instance that is a child of the object instance specified in the selected message filter. Referring to FIG. 2, for example, a message filter having a message criterion of "4-6" and specifying an object identifier of "top/I0/I1", would also be applied to messages with a message criterion of "4-6" and generated while processing a child node of the node "top/I0/I1". For example, a message generated while processing the child node "top/I0/I1/I1" (and therefore having an object identifier of "top/I0/I1/I1") and having a message criterion of "4-6" may also be suppressed. Using inheritance may serve to minimize the number of filter definitions that each message must be checked against.

Method 400 illustrates exemplary operations that may be performed by a system for message filtering. Other operation that may be specific to the first process or any subsequent process are not shown. As illustrated in FIG. 4, the system is able to efficiently build the filter table while also building the tree. This avoids continually traversing the tree for elaboration and then again for filtering messages, which may be resource and time consuming. Subsequently, as messages are received for processing, the system is able to perform lookup operations using the table faster than had the table not been created. Using other conventional message suppression techniques, systems must continually consult the hierarchy to determine where a given object is located prior to determining whether to suppress the message. As noted, this can be time consuming.

Table 2 illustrates another example of a filter table where additional metadata is stored with or as part of the message filter.

TABLE 2

| Message Criterion | Hierarchical Path 1 | Hierarchical Path 2 | Author | Note | Timestamp |
|---|---|---|---|---|---|
| 5-9 | a/b/c/d | a/b/x/y | John Doe | Filter on block "a/b" to ignore skew | 20150720-22:30 |

In the example of Table 2, the system may store additional metadata such as the author of a message suppression design constraint, the reason (e.g., notes) for the purpose of the message suppression design constraint, and a time that the message filter was created in the filter table. The additional data may be persisted with, or as part of, the message filter for review at a later time. In one aspect, one or more items of the metadata, e.g., the author and/or note, may be read from the design constraint and added to the message filter in the filter table automatically. In another aspect, one or more other items of information such as the timestamp specifying a data and/or time of creation of the message filter, may be generated by the system and added automatically. The additional metadata allows tracking and management of the message filters.

The exemplary processing described with reference to FIG. 4 may also be applied in cases where elaboration is not yet performed and/or where hierarchical object names relative to an entire design are unavailable. In one example, an EDA system may perform "Out Of Context (OOC) Synthesis". OOC synthesis refers to the processing of a particular block, or portion of a design, separately from other blocks and/or portions of the design. In this case, the complete object hierarchy of the design is not known. As such, a partial hierarchy tree may be determined prior to implementation of OOC synthesis. In that case, partial hierarchy may be specified for message filters and applied to the entire scope of a particular OOC synthesis run.

For purposes of illustration, consider the case where a partial object hierarchy is specified as portion 205 of HDL design 200 of FIG. 2. Portion 205 includes nodes "top", "I0:macc4", "I1:macc4", "I9:my_module", and "I2:macc8" representing a partial object hierarchy. The system may perform OOC synthesis for macc8 (the instance information "I2" is not available in the OOC example). In that case, all message filters for the object macc8, presuming that the message criterion matches, may be applied to suppress messages during OOC synthesis for macc8. The full object hierarchy for the object is not needed.

In another example, the EDA system may add other attributes to the messages that are generated when performing high level synthesis on a design specified in an HLL. For example, the EDA system may add attributes to generated messages such as the source code file and/or line of the source code file being processed when the message was generated. As an example, a compiler error message may have attributes such as "meta-type=source_file_line, meta-value=myfile.c:1234" indicating that the message is related to line 1234 of source code file "myfile.c." The source code file and line number may be used as the object identifier.

In such an arrangement, message filters may be defined for individual source code files and/or for individual source code file and line number pairings with the message filters being applied based upon such object identifiers. An exemplary message filter in the filter table may specify a message criterion and a particular source code file and source code file line number as the object identifier.

In still another example, source code files may be tagged. As the EDA system generates object instances from the source code file, each object instance may be tagged with the same tag as the particular source code file from which the object instance was created during elaboration. The tagging may uniquely identify the type of the object that is generated, but not the particular instance within the hierarchy. For purposes of illustration, consider an EDA system using an attribute such as a Vendor Library Name Version or VLNV identifier. An example of an identifier may be "Xilinx.com: ip:fifo:1.0". The identifier, which is specified in the source code file, may be used as the tag and applied to each object instance created from the file.

Figure 5:
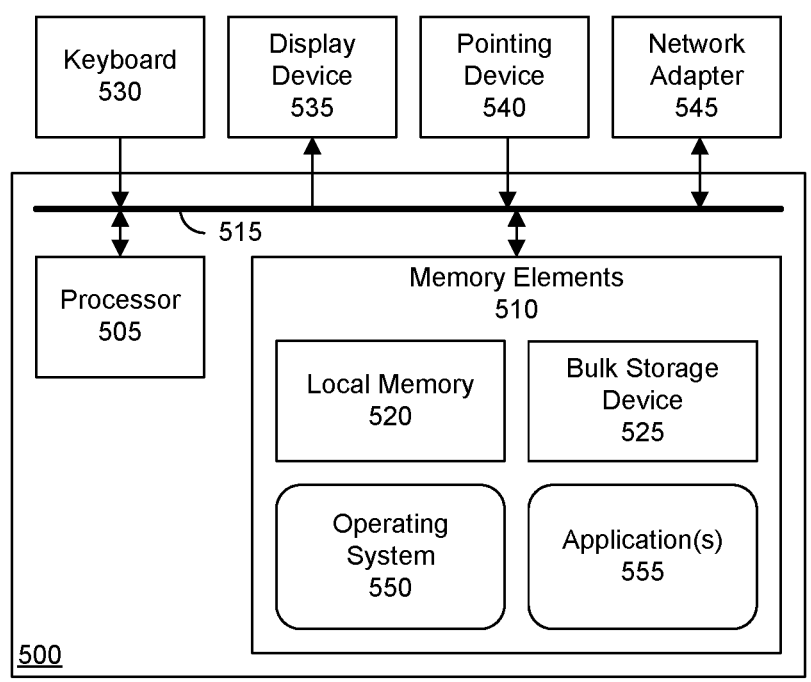
FIG. 5 is an exemplary architecture for a data processing system.

FIG. 5 is an exemplary architecture 500 for a data processing system. Architecture 500 may be used to implement systems and/or devices that include a processor and memory and that are capable of performing the operations described within this disclosure. For example, architecture 500 may be used to implement an EDA system or other computer-based development system. In some cases, the particular system implemented using architecture 500 may include fewer components or more components than illustrated in FIG. 5. Further, the particular operating system and/or application(s) included may vary.

As pictured, architecture 500 includes at least one processor, e.g., a central processing unit (CPU), 505 coupled to memory elements 510 through a system bus 515 or other suitable circuitry. Architecture 500 stores computer-readable program instructions (also referred to as "program code") within memory elements 510. Memory elements 510 may be considered an example of computer readable storage media. Processor 505 executes the program code accessed from memory elements 510 via system bus 515. In one aspect, memory elements 510 include one or more physical memory devices such as, for example, a local memory 520 and one or more bulk storage devices 525. Local memory 520 refers to random access memory (RAM) or other non-persistent memory device(s) generally used during actual execution of the program code. Bulk storage device 525 may be implemented as a hard disk drive (HDD), solid state drive (SSD), or other persistent data storage device. Architecture 500 may also include one or more cache memories (not shown) that provide temporary storage of at least some program code in order to reduce the number of times program code must be retrieved from bulk storage device 525 during execution.

Input/output (I/O) devices such as a keyboard 530, a display device 535, and a pointing device 540 may optionally be coupled to architecture 500. In some cases, one or more of the I/O devices may be combined as in the case where a touchscreen is used as display device 535. In that case, display device 535 may also implement keyboard 530 and/or pointing device 540.

The I/O devices may include one or more network adapters 545 that may be coupled to architecture 500 to enable architecture 500 to become coupled to other systems, computer systems, remote printers, and/or remote storage devices through intervening private or public networks and/or through direct connections (e.g., peer-to-peer connections). Modems, cable modems, Ethernet cards, wired transceivers, and wireless transceivers (e.g., wireless radios) are examples of different types of network adapter 545 that may be used with architecture 500. Depending upon the particular device implemented with architecture 500, the specific type of network adapter, or network adapters as the case may be, will vary.

As pictured in FIG. 5, memory elements 510 store an operating system 550 and one or more applications 555 such as, for example, EDA application 105. In one aspect, operating system 550 and application 555, being implemented in the form of program code, are executed by architecture 500. For example, processor 505 may execute operating system 550 and/or application 555. As such, operating system 550 and application 555 may be considered an integrated part of architecture 500. Operating system 550, application 555, and any data items used, generated, and/or operated upon by architecture 500 are functional data structures that impart functionality when employed as part of a system or device implemented using architecture 500. For example, a device and/or system implemented using architecture 500 or a combination of such devices and/or systems may be programmed to initiate executable operations as described within this disclosure.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "hardware description language" or "HDL" is a computer-language that facilitates the documentation, design, and manufacturing of a digital system, such as an integrated circuit. An HDL combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

As defined herein, the term "high level programming language" or "HLL" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of message filtering may include, during a first processing phase of a design specified in source code, creating a filter table including message filters and storing the filter table in a memory using a processor. Each message filter may specify a message criterion and an object identifier of the design. The method may include, during a subsequent processing phase of the design, comparing received messages with the message filters of the filter table using the processor. Responsive to determining that a selected message matches a message criterion and an object identifier of a selected message filter, the message may be suppressed using the processor.

In one aspect, creating a filter table of message filters may include, for a selected object of the design, determining whether a design constraint specifying message suppression is associated with the selected object and, responsive to determining that a design constraint for message suppression is associated with the selected object, creating a message filter in the filter table according to the design constraint.

The method may include writing metadata to the filter table as part of the message filter.

In another aspect, creating a filter table of message filters may include, for a selected object of the design, determining whether a design constraint is specified, responsive to determining that a design constraint is specified, executing the design constraint to determine whether the design constraint specifies message suppression applicable to an object instance created from the selected object, and selectively creating a message filter in the filter table specifying the object instance according to the execution of the design constraint.

The design may be specified as a hierarchical data structure in tree form. The object identifier may be a path specifying a particular object instance.

The method may include suppressing a message that matches the message criterion of the selected message filter and that is from an object instance that is a child of the object instance specified in the selected message filter.

In a further aspect, the object identifier may be specified as a source code file and a line of the source code file.

A system for message filtering may include a processor programmed to initiate executable operations. The executable operations may include, during a first processing phase of a design specified in source code, creating a filter table including message filters and storing the filter table in a memory. Each message filter may specify a message criterion and an object identifier of the design. The executable operations may include, during a subsequent processing phase of the design, comparing received messages with the message filters of the filter table and, responsive to determining that a selected message matches a message criterion and an object identifier of a selected message filter, suppressing the message.

In one aspect, creating a filter table of message filters may include, for a selected object of the design, determining whether a design constraint specifying message suppression is associated with the selected object and, responsive to determining that a design constraint for message suppression is associated with the selected object, creating a message filter in the filter table according to the design constraint.

The processor may be further programmed to initiate executable operations including writing metadata to the filter table as part of the message filter.

In another aspect, creating a filter table of message filters may include, for a selected object of the design, determining whether a design constraint is specified, responsive to determining that a design constraint is specified, executing the design constraint to determine whether the design constraint specifies message suppression applicable to an object instance created from the selected object, and selectively creating a message filter in the filter table specifying the object instance according to the execution of the design constraint.

The design may be specified as a hierarchical data structure in tree form. The object identifier may be a hierarchical path specifying a particular object instance.

The processor may be further programmed to initiate executable operations including suppressing a message that matches the message criterion of the selected message filter and that is from an object instance that is a child of the object instance specified in the selected message filter.

In still another aspect, the object identifier may be specified as a source code file and a line of the source code file.

A non-transitory computer-readable storage medium may have instructions stored thereon which, when executed by a processor, perform a method. The method may include, during a first processing phase of a design specified in source code, creating a filter table comprising message filters and storing the filter table in a memory using a processor. Each message filter may specify a message criterion and an object identifier of the design. The method may include, during a subsequent processing phase of the design, comparing received messages with the message filters of the filter table using the processor. Responsive to determining that a selected message matches a message criterion and an object identifier of a selected message filter, the message may be suppressed using the processor.

In one aspect, creating a filter table of message filters may include, for a selected object of the design, determining whether a design constraint specifying message suppression is associated with the selected object and, responsive to determining that a design constraint for message suppression is associated with the selected object, creating a message filter in the filter table according to the design constraint.

The method may include writing metadata to the filter table as part of the message filter.

In another aspect, creating a filter table of message filters may include, for a selected object of the design, determining whether a design constraint is specified, responsive to determining that a design constraint is specified, executing the design constraint to determine whether the design constraint specifies message suppression applicable to an object instance created from the selected object, and selectively creating a message filter in the filter table specifying the object instance according to the execution of the design constraint.

The design may be specified as a hierarchical data structure in tree form. The object identifier may be a path specifying a particular object instance.

The method may include suppressing a message that matches the message criterion of the selected message filter and that is from an object instance that is a child of the object instance specified in the selected message filter.

In still another aspect, the object identifier may be specified as a source code file and a line of the source code file.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of message filtering, comprising:
   during a first processing phase of a design for an electronic circuit, creating a filter table comprising message filters and storing the filter table in a memory using a processor, wherein the first processing phase includes elaboration of the design for implementation within an integrated circuit;
   wherein each message filter specifies a message criterion and an object identifier of the design, wherein the object identifier corresponds to an object of the design for the electronic circuit;
   during a subsequent processing phase of the design, comparing received messages with the message filters of the filter table using the processor; and responsive to determining that a selected message matches a message criterion and an object identifier of a selected message filter, suppressing the message using the processor.

2. The method of claim 1, wherein the creating the filter table of message filters comprises:
   for a selected object of the design, determining whether a design constraint specifying message suppression is associated with the selected object; and
   responsive to determining that a design constraint for message suppression is associated with the selected object, creating a message filter in the filter table according to the design constraint.

3. The method of claim 2, further comprising:
   writing metadata to the filter table as part of the message filter.

4. The method of claim 1, wherein the creating the filter table of message filters comprises:
   for a selected object of the design, determining whether a design constraint is specified;
   responsive to determining that a design constraint is specified, executing the design constraint to determine whether the design constraint specifies message suppression applicable to an object instance created from the selected object; and
   selectively creating a message filter in the filter table specifying the object instance according to the execution of the design constraint.

5. The method of claim 1, wherein the design is specified as a hierarchical data structure in tree form and the object identifier is a path specifying a particular object instance.

6. The method of claim 5, further comprising:
   suppressing a message that matches the message criterion of the selected message filter and that is from an object instance that is a child of the object instance specified in the selected message filter.

7. The method of claim 1, wherein the object identifier is specified as a source code file and a line of the source code file.

8. A system for message filtering, comprising:
   a processor programmed to initiate executable operations comprising:
   during a first processing phase of a design for an electronic circuit, creating a filter table comprising message filters and storing the filter table in a memory, wherein the first processing phase includes elaboration of the design for implementation within an integrated circuit;
   wherein each message filter specifies a message criterion and an object identifier of the design, wherein the object identifier corresponds to an object of the design for the electronic circuit;
   during a subsequent processing phase of the design, comparing received messages with the message filters of the filter table; and
   responsive to determining that a selected message matches a message criterion and an object identifier of a selected message filter, suppressing the message.

9. The system of claim 8, wherein the creating the filter table of message filters comprises:
   for a selected object of the design, determining whether a design constraint specifying message suppression is associated with the selected object; and
   responsive to determining that a design constraint for message suppression is associated with the selected object, creating a message filter in the filter table according to the design constraint.

10. The system of claim 9, wherein the processor is further programmed to initiate executable operations comprising:
    writing metadata to the filter table as part of the message filter.

11. The system of claim 8, wherein the creating the filter table of message filters comprises:
    for a selected object of the design, determining whether a design constraint is specified;
    responsive to determining that a design constraint is specified, executing the design constraint to determine whether the design constraint specifies message suppression applicable to an object instance created from the selected object; and
    selectively creating a message filter in the filter table specifying the object instance according to the execution of the design constraint.

12. The system of claim 8, wherein the design is specified as a hierarchical data structure in tree form and the object identifier is a hierarchical path specifying a particular object instance.

13. The system of claim 12, wherein the processor is further programmed to initiate executable operations comprising:
    suppressing a message that matches the message criterion of the selected message filter and that is from an object instance that is a child of the object instance specified in the selected message filter.

14. The system of claim 8, wherein the object identifier is specified as a source code file and a line of the source code file.

15. A non-transitory computer-readable storage medium having instructions stored thereon which, when executed by a processor, perform a method of message filtering comprising:
    during a first processing phase of a design for an electronic circuit, creating a filter table comprising message filters and storing the filter table in a memory using the processor, wherein the first processing phase includes elaboration of the design for implementation within an integrated circuit;
    wherein each message filter specifies a message criterion and an object identifier of the design, wherein the object identifier corresponds to an object of the design for the electronic circuit;
    during a subsequent processing phase of the design, comparing received messages with the message filters of the filter table using the processor; and
    responsive to determining that a selected message matches a message criterion and an object identifier of a selected message filter, suppressing the message using the processor.

16. The non-transitory computer-readable storage medium of claim 15, wherein the creating the filter table of message filters comprises:
    for a selected object of the design, determining whether a design constraint specifying message suppression is associated with the selected object; and
    responsive to determining that a design constraint for message suppression is associated with the selected object, creating a message filter in the filter table according to the design constraint.

17. The non-transitory computer-readable storage medium of claim 16, further comprising:
    writing metadata to the filter table as part of the message filter.

18. The non-transitory computer-readable storage medium of claim 15, wherein the creating the filter table of message filters comprises:
  for a selected object of the design, determining whether a design constraint is specified;
  responsive to determining that a design constraint is specified, executing the design constraint to determine whether the design constraint specifies message suppression applicable to an object instance created from the selected object; and
  selectively creating a message filter in the filter table specifying the object instance according to the execution of the design constraint.

19. The non-transitory computer-readable storage medium of claim 15, wherein the design is specified as a hierarchical data structure in tree form and the object identifier is a hierarchical path specifying a particular object instance.

20. The non-transitory computer-readable storage medium of claim 19, further comprising:
  suppressing a message that matches the message criterion of the selected message filter and that is from an object instance that is a child of the object instance specified in the selected message filter.

* * * * *